United States Patent [19]
Tench et al.

[11] Patent Number: 5,595,637
[45] Date of Patent: Jan. 21, 1997

[54] PHOTOELECTROCHEMICAL FABRICATION OF ELECTRONIC CIRCUITS

[75] Inventors: D. Morgan Tench, Ventura; Leslie F. Warren, Jr., Camarillo; Young J. Chung, Calabasas, all of Calif.

[73] Assignee: Rockwell International Corporation, Seal Beach, Calif.

[21] Appl. No.: 559,952

[22] Filed: Nov. 17, 1995

[51] Int. Cl.$^6$ .............................. C25D 5/00; C25D 5/02; C25D 7/12; B05D 5/12
[52] U.S. Cl. .............................. 205/91; 205/92; 205/123; 205/137; 205/157; 427/98; 427/305; 427/437
[58] Field of Search .............................. 205/91, 92, 123, 205/137, 143, 151, 157; 427/98, 305, 437

[56] References Cited

U.S. PATENT DOCUMENTS

| | | | |
|---|---|---|---|
| 4,430,165 | 2/1984 | Inoue | 204/15 |
| 4,608,138 | 8/1986 | Kobayashi | 204/129.3 |
| 5,206,102 | 4/1993 | Tench | 430/49 |

FOREIGN PATENT DOCUMENTS

| | | |
|---|---|---|
| 226019 | 8/1985 | Germany. |
| 5-148657 | 6/1993 | Japan. |
| 2106542 | 4/1983 | United Kingdom. |

OTHER PUBLICATIONS

Inoue et al., "Photoelectrochromic Characteristics of Photoelectrochemical Imaging System with a Semiconductor/Solution (Metallic ion) Junction", J. Electrochem. Soc., pp. 1582–1588.

Primary Examiner—Bruce F. Bell
Assistant Examiner—Edna Wong
Attorney, Agent, or Firm—John C. McFarren

[57] ABSTRACT

A photoelectrochemical method and apparatus are disclosed for fabricating electronic circuits. An electroplating solution is applied to the surface of a reverse biased p-type semiconductor material, such as NiO. The solution-covered NiO surface is illuminated with a light beam directed by computer aided design data to photoelectrochemically deposit a seed layer of metal in an electronic circuit pattern. The seed layer may be thickened by further deposition in a plating bath to form metallic circuit traces on the NiO. If desired, the metallic circuitry may be transferred from the NiO to an alternate substrate having a low dielectric constant. The porosity of the NiO surface can be adjusted to optimize the metallic circuit adhesion for image retention or ease of transfer. The metallic traces may also be treated to reduce adhesion of subsequently deposited metal that can be transferred readily. If sufficient residual metal remains on the NiO surface after circuit transfer, the trace can be rethickened to transfer multiple circuits of the same pattern without reimaging. An old metallic image can be electro-dissolved by changing the bias of the NiO with respect to the plating bath, thereby erasing the old image so that a new circuit pattern can be formed by photoelectrochemical deposition. The process can be performed on a rotating cylinder so that electronic circuits can be produced in a continuous process of photoelectrochemical deposition, seed metal thickening, adhesion reduction, circuit transfer, and image erasure that provides advantages in cost, circuit resolution, and environmental protection.

19 Claims, 1 Drawing Sheet

5,595,637

PHOTOELECTROCHEMICAL FABRICATION OF ELECTRONIC CIRCUITS

TECHNICAL FIELD

The present invention relates to fabrication of electronic printed circuits and, in particular, to a photoelectrochemical method and apparatus for making electronic circuits.

BACKGROUND OF THE INVENTION

Printed circuits are widely used in the electronics industry and are commonly manufactured by a "subtractive" process. The conventional subtractive process uses a copper foil bonded to a polymer laminate and includes production of a photographic negative of the circuit layout, photoresist imaging of the circuit on the copper foil, and chemical etching to remove excess copper and leave the copper circuit bonded to the polymer material. Although this multi-step process is effective, it uses organic chemicals and solvents and generates large volumes of spent copper etchant solution that must be recycled. In addition, resolution of the final printed circuit is limited by the photographic negative and photoresist processes as well as by undercutting during the etching step.

With current advances in the electronics industry, there is a demand for ultra-fine electronic circuit layouts that are beyond the capabilities of conventional "subtractive" techniques. Direct laser exposure of photoresist film is a known method for eliminating the photographic negative, but this technique does not address the remaining undesirable characteristics of subtractive processes described above. On the other hand, "additive" electronic circuit fabrication methods have not been widely used because they involve electroless copper plating, which is a very slow process that requires multi-step chemical activation of the polymer support material. Consequently, them is a need for a more efficient electronic circuit fabrication process that improves circuit line resolution, reduces the number of process steps, and reduces or eliminates the generation of environmentally objectionable waste products.

SUMMARY OF THE INVENTION

The present invention comprises a photoelectrochemical method and apparatus for fabricating electronic circuits. The method includes providing a surface of p-type semiconductor material, applying an electroplating solution to the semiconductor surface, and providing a reverse bias voltage (V–) on the semiconductor surface relative to the plating solution (V+). A focused beam from a laser or other light source is used to illuminate the solution-covered semiconductor surface, tracing a predetermined pattern of an electronic printed circuit. The light beam acting on the reverse biased p-type semiconductor material in contact with the electroplating solution photoelectrochemically deposits a "seed" layer of metal on the semiconductor surface. The seed layer of metal may be thickened to form metallic circuit traces by further electro- or electroless deposition from the same (or separate) plating bath.

In a preferred embodiment, a thin film of copper plating solution is applied to a nickel substrate coated with p-type NiO semiconductor material prepared by a sol-gel process. A seed layer of copper metal is deposited photoelectrochemically by illuminating a desired pattern (such as by scanning the light beam, moving the semiconductor surface relative to the light beam, or both in concert) on the solution-covered, reverse biased p-NiO surface. The seed layer can be thickened (as desired) to complete the printed circuit by electro- or electroless deposition in the same or a separate plating bath without further illumination. The resulting metal circuits on NiO-coated substrates are suitable for some low-frequency end use applications, typically those not requiring a substrate with a low dielectric constant. As a process variation, the copper circuitry can be transferred from the p-NiO surface to an alternate substrate, such as a sheet of adhesive coated (or "green stage") laminate material (such as epoxy-fiberglass or polyimide, for example), that has a low dielectric constant. Such circuit bearing sheets can then be laminated together to form multilayer circuit boards, if desired. The porosity of the p-NiO surface can be adjusted by varying the substrate texture and/or the sol-gel processing conditions to optimize the copper circuit adhesion for image retention or ease of circuit transfer as required for a particular printed circuit fabrication process. Alternatively, the seed layer may be slightly thickened and then treated electrochemically, chemically, or mechanically to reduce adhesion of subsequently electrodeposited metal that is to be transferred.

If sufficient residual copper is retained on the NiO surface after a circuit transfer step, it is not necessary to re-image the NiO surface to transfer multiple circuits of the same pattern—the residual copper can simply be rethickened as before without further illumination. To prepare for a different circuit pattern, the old copper image can be electrodissolved by applying a forward electrical bias (V+) to the p-NiO surface relative to the plating bath (V–), thereby erasing the old image so that a new circuit pattern can be formed by photoelectrochemical deposition with reverse bias as described above. The entire process can be performed by imaging on a semiconductor coated surface of a rotating cylinder (for example) so that printed circuits can be produced in a continuous process of scanning photoelectrochemical deposition, seed metal thickening (if desired), optional adhesion reduction treatment and further thickening, circuit transfer, additional thickening and transfer steps as necessary, and image erasure followed by photoelectrochemical deposition of new circuit patterns.

Compared to known methods, the photoelectrochemical circuit fabrication process of the present invention provides significant advantages in cost, environmental protection, and circuit resolution. All of the labor and chemicals expended in conventional photoresist imaging are eliminated, and no spent copper etchant solution waste is generated. Furthermore, high resolution patterns can be generated using computer aided design software and turned directly into printed circuits using laser imaging without the need for artwork or photoresist steps.

A principal object of the invention is fabrication of electronic circuits. Features of the invention include photoelectrochemical deposition with an optional circuit transfer process. An advantage of the invention is fabrication of high resolution electronic circuits using computer aided design data with a direct, low cost, environmentally benign photoelectrochemical process.

BRIEF DESCRIPTION OF THE DRAWINGS

For a more complete understanding of the present invention and for further advantages thereof, the following Detailed Description of the Preferred Embodiments makes reference to the accompanying Drawings, in which.

DETAILED DESCRIPTION OF THE PREFERRED EMBODIMENTS

Figure 1:
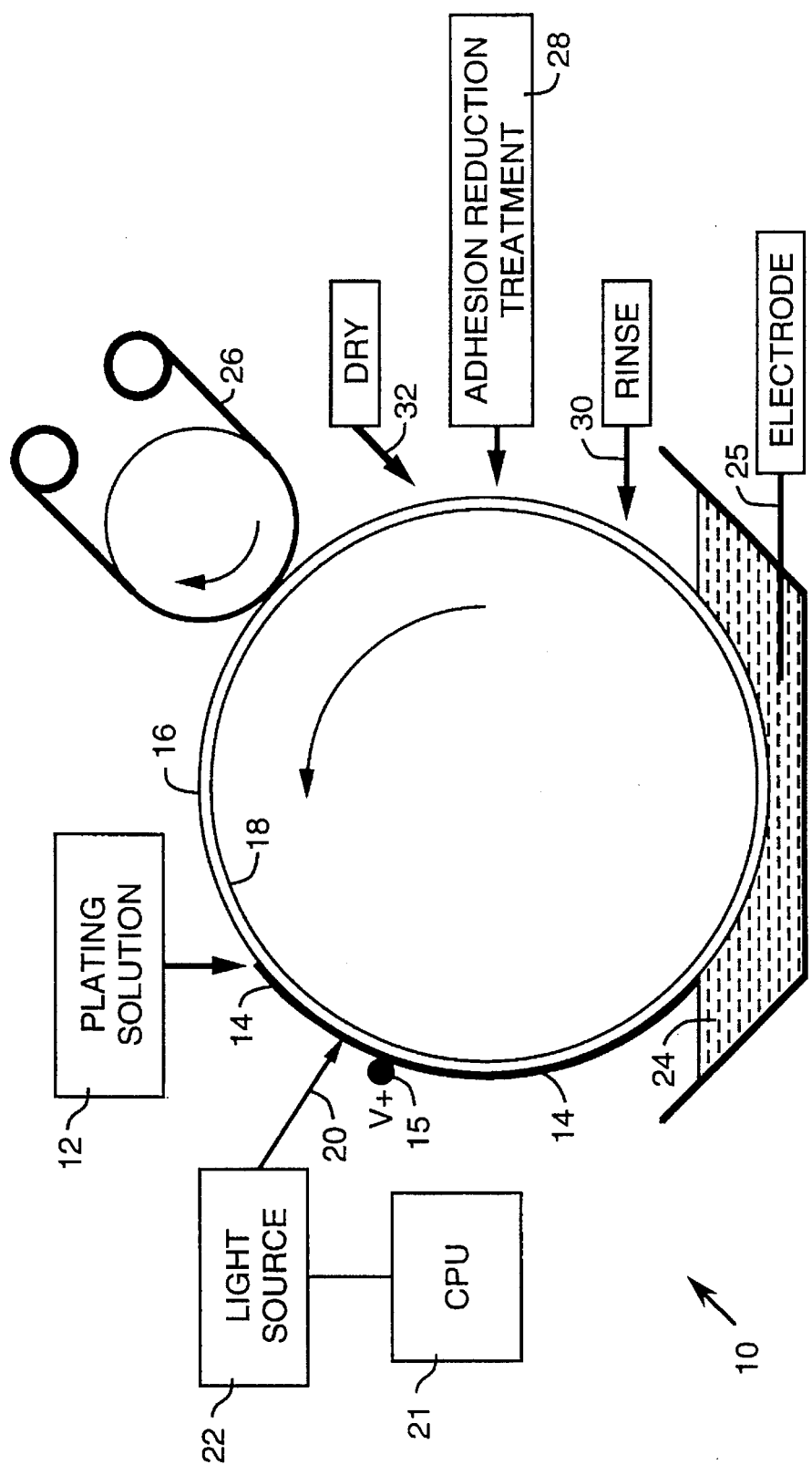
FIG. 1 is a schematic, cross-sectional side view of an apparatus for performing the present method of photoelectrochemical fabrication of an electronic circuit, including the optional step of transferring the circuit to an alternate substrate.

The present invention comprises a photoelectrochemical method and apparatus for fabricating electronic circuits. Light is known to induce deposition of metals, including copper, either by localized heating or by photogeneration of electrons at semiconductor electrodes. Thermal deposition is less desirable for most applications because it is relatively inefficient and slow. In the art of photodeposition, a direct-to-plate photoelectrochemical imaging system for printing presses is described in U.S. Pat. No. 5,206,102, the teachings of which are incorporated herein by reference.

A schematic diagram of an exemplary apparatus 10 for performing the present method of electronic circuit fabrication is illustrated in FIG. 1. The method includes the step of providing a surface of a p-type semiconductor material 16 on a substrate, which may comprise a plate or a cylinder 18, for example. A metal plating solution 12 is applied as a film 14 covering at least a portion of the semiconductor surface 16. An electrode 15 may be placed in direct electrical contact with plating solution film 14 (but not in contact with semiconductor material 16) to apply a positive bias voltage (V+) to the plating solution relative to a reverse bias (V−) on the semiconductor material 16. A beam of light 20 (such as a laser beam, a focused beam, or multiple beams, for example) from a light source 22 illuminates the solution-covered surface of the semiconductor material 16 (as by scanning of beam 20 and/or moving semiconductor surface 16, for example), thereby tracing a predetermined pattern of an electronic circuit. Light beam 20 is generally controlled and directed, typically in concert with plate movement or cylinder rotation, by a computer processor (CPU) 21 using computer aided circuit design data. Light beam 20 acting on semiconductor material 16, which is reverse biased with respect to plating solution film 14, photoelectrochemically deposits a "seed" layer of metal on semiconductor material 16. The seed layer of metal may be thickened (as necessary or desired) to form the metallic traces of the electronic circuit without further illumination by additional electrodeposition from solution 14 or plating bath 24 biased (V+) with electrode 25. As an alternative, the seed layer may be thickened in plating bath 24 (or in a separate "electroless" plating bath) without electrical bias.

Photoelectrochemical deposition of metals on a coating of titanium dioxide has also been investigated. Titanium dioxide is an n-type semiconductor, however, and metal deposition occurs in the dark areas surrounding a laser beam spot. This results in deposition of dual circuit traces having ill-defined width rather than a desired single trace of high resolution. Therefore, a p-type semiconductor oxide, such as NiO, is preferred for its superior definition and direct-write characteristics.

Nickel oxide (NiO), the preferred material for coating 16, may be applied on a plate or cylinder 18 by methods such as thermal oxidation of nickel, electrochemical deposition/passivation (followed by thermal dehydration), vacuum deposition (e.g., magnetron sputtering), chemical vapor deposition, or sol-gel deposition. Although the dielectric constant for bulk NiO is too high (12) for use as a circuit insulator material for some electronic applications, the effective dielectric constant can be reduced to an acceptable range (3–9) by using a very thin NiO coating 16 on a low dielectric substrate and/or adjusting the sol-gel processing conditions (by heating more rapidly, for example) so that the microporosity of NiO coating 16 is increased. Electrical contact with such an NiO coating on a low dielectric substrate can be made, for example, by evaporating a thin nickel metal strip around the perimeter of the coating. Sol-gel processing conditions can also be adjusted to provide a more stoichiometric NiO coating with low conductivity, for example, by heat treating the NiO coating (with or without an applied metallic circuit) under reduced oxygen partial pressure (such as in a nitrogen atmosphere, for example).

The substrate of cylinder 18 under NiO coating 16 may comprise metallic nickel (Ni), which provides good adhesion and readily passivates to render NiO coating 16 "self-healing." Sol-gel deposition is a preferred method of forming coating 16 because it is a relatively low-temperature process and it facilitates adjustment of the charge carrier concentration in NiO coating 16 by means of $Li^+$ incorporation or variation in NiO stoichiometry. In addition, the porosity of the NiO surface 16 can be adjusted by sol-gel processing conditions to optimize the preferred copper circuit adhesion for image retention or ease of circuit transfer. The best photoresponse of coating 16 has been attained using an NiO sol-gel coating with a $Li^+$-doped underlayer (approximately 5 cation %), which provides a low resistance contact between the Ni substrate and the photoactive NiO coating. A preferred substrate is formed of nickel (Ni) electrodeposited at high current density (80–100 $mA/cm^2$) from a sulfamate bath, which produces a strong (100) crystallographic orientation. The semiconductor photoelectrochemical process of the present invention also allows the fabrication of capacitors and resistors from the semiconductor coating as an integral part of the circuit card.

The sol-gel process of forming coating 16 involves thermolysis of a sol (e.g., a film formed from evaporation of Ni(II) acetate dissolved in 2-methoxyethanol) to form nickel oxide (possibly via a nickel hydroxide intermediate), which is then crystallized by heating at higher temperatures. The sol is applied to the substrate (e.g., cylinder 18) by spin coating, spraying, dipping, or meniscus coating, for example. Heat is applied to effect conversion to NiO (and to drive off water, excess solvent, and organic by-products). Lithium doping may be used to improve the back ohmic contact between NiO coating 16 and the substrate material of cylinder 18, and to optimize the charge carrier concentration in overlayers of NiO coating 16 for maximum photoresponse. The thermolysis steps of the sol-gel process can be summarized as:

$$Ni(CH_3CO_2)_2 \cdot 4\ H_2O \rightarrow Ni(OH)_2 + 2\ CH_3CO_2H + 2\ H_2O$$

(Nickel(II) acetate tetrahydrate→nickel hydroxide+acetic acid+water)

$$Ni(OH)_2 \rightarrow NiO + H_2O\ .$$

In one experiment using the sol-gel process, 5 coats of NiO, each 0.2 μm thick, were applied to form a 1.0 μm thick NiO coating 16 over a 0.2 μm thick coating of lithium-doped (5 cation %) NiO on a nickel substrate (prepared by electrodeposition from a nickel sulfamate bath onto a stainless steel mandrel to 10 mil thickness and then removed). The sol was prepared by refluxing (6 minutes) a mixture of 1.0 g Ni acetate tetrahydrate and 2.5 g 2-methoxyethanol, and diluting the sol obtained with 3.6 ml of methanol. To produce the Li-doped underlayer, 22 mg of lithium acetate dihydrate were dissolved in the methanol used for dilution of the sol.

Each coat was applied by spin coating at 2700 rpm for 30 seconds; air drying for 30 minutes; and heating in air at 650° C. for 10 hours. Providing a copper pyrophosphate plating solution (pH 8.0) in contact with the reverse-biased NiO surface (–400 mV versus the Cu/Cu pyrophosphate) and moving the NiO surface in front of a focused beam from an argon ion laser (351 nm wavelength light) produced a copper image that was allowed to thicken at the bias potential for 15 minutes to form a visible copper line on the NiO surface with the same width as the focused laser beam.

Plating solution 12 may comprise a copper pyrophosphate electrolyte, for example. Although an externally applied electrical bias is not necessary in all embodiments of the invention, image cylinder 18 and coating 16 are usually reverse biased (V–) with respect to the plating solution (V+). The action of light beam 20 passing through the plating solution film 14 on NiO coating 16 causes about a monolayer of copper metal to be formed on the surface of coating 16 by cathodic photoelectrochemical deposition. Light beam 20 generates electron-hole pairs in semiconductor coating 16, a space charge field separates the charge, and the electrons reduce the $Cu^{2+}$ ions in plating film 14 to metallic copper, probably by means of intermediate species, such as hydrogen atoms from water, or proton reduction. The overall photoelectrochemical process may be summarized as:

photons+p-NiO→$h^+$ (holes)+$e^-$(photoelectrons)

$Cu^{2+}$+2 $e^-$→Cu.

Copper pyrophosphate electrolyte is a preferred plating solution 12 because it is energetically favorable, it is environmentally benign with low corrosivity at pH 8 to 9, and it yields high quality copper deposits without organic additives. Other copper plating electrolytes may be used, including acid copper sulfate, copper cyanide, and any of various electroless copper plating baths. Electroless copper plating baths (i.e., those without externally applied electrical bias) permit copper deposition to proceed spontaneously after illumination. Electrolytes containing copper salts not normally employed for electrodeposition may also be used. However, cathodic or electroless deposition on the NiO surface in the absence of light may limit the utility of some electrolytes, especially those not containing strong metal complexing agents needed to retard such unwanted deposition. Because the process of the present invention involves a symmetrical, relatively smooth plating surface, good throwing power of the electrolyte (i.e., to plate irregular surfaces) is not a consideration. To enhance the efficiency and/or speed of the image writing process, the thin layer of material deposited photoelectrochemically can be thickened by further electro- or electroless deposition in film 14 or plating bath 24 without continued illumination (as described above).

Although the deposition of seed metal is an electrochemical process, the anodic reaction can also occur on non-illuminated areas of the semiconductor coating 16. In some embodiments of the invention, the inherent voltage difference (i.e., band bending) derived from equilibrium of semiconductor coating 16 with plating electrolyte 14 may be sufficient to provide effective separation of photogenerated charge carriers. Therefore, an external electrode may not be required in these cases. This is particularly true for an electroless plating bath containing a chemical reducing agent that produces a negative voltage bias on the semiconductor, inducing band bending. However, an electrode bar 15 (comprising platinum or copper, for example) is generally placed in contact with plating solution film 14 to apply a positive voltage bias (V+) to film 14 with respect to semiconductor surface 16. For good light utilization, the NiO space charge thickness should be optimized with respect to the light absorption depth; there should be a low charge carrier recombination rate (i.e., low semiconductor defect density); and there should be a low-resistance back contact between NiO coating 16 and the supporting substrate 18 (or the electrical contact material if the substrate is a low dielectric material).

In a preferred embodiment of the invention illustrated in FIG. 1, film 14 comprises a copper plating solution 12 applied to p-type NiO surface 16, which is prepared by a sol-gel process as described above and coated on a nickel substrate, such as cylinder 18. Copper metal seed traces (about a monolayer) are deposited photoelectrochemically in a desired pattern directly on p-NiO coating 16 illuminated by action of scanning or pulsed light beam 20, typically in concert with movement of NiO surface 16. Light beam residence times in the low microsecond range with a 150 mW argon ion laser focused to a beam diameter of 50 μm, for example, have been shown to be sufficient to deposit seed metal on p-NiO surface 16 reversed biased with respect to plating solution film 14. Seed metal traces can be thickened (if desired) in film 14 or plating bath 24 by electroless deposition or by electrodeposition with electrodes 15 and/or 25 having a positive bias (V+) with respect to NiO surface 16. The resulting metal circuits (such as those typically formed on planar NiO-coated nickel substrates) are appropriate for some electronic end use applications, particularly those involving low-frequency alternating currents that do not require a substrate having a low dielectric constant, for example. Within limits, the sol-gel processing conditions can be adjusted as described above to reduce the effective dielectric constant to a lower range (3–9), if necessary.

In a variation or extension of the basic method, the copper circuitry formed on p-NiO surface 16 is transferred to an alternate substrate, such as a sheet of adhesive-coated (or "green stage") laminate material 26 (such as epoxy-fiberglass or polyimide, for example), that has a low dielectric constant. Such circuit-bearing sheets 26 can then be laminated together to form multilayer circuit boards, if desired. As described above, the porosity of p-NiO surface 16 can be adjusted by varying the sol-gel processing conditions to optimize the copper circuit adhesion for ease of circuit transfer (rather than circuit retention as in the basic process). As an alternative, the seed layer thickening process can be interrupted and the copper circuitry treated chemically, electrochemically, or mechanically (as indicated by function block 28 in FIG. 1) to reduce the adhesion of subsequently deposited copper metal that is to be transferred to alternate substrate material 26.

Chemical adhesion reduction has been demonstrated using an alkyl-substituted benzimidazole coating (Enteck 106A solution, marketed by Enthone, Inc.) applied to a copper plated sheet. The coated copper surface was masked with plater's tape to leave a rectangular area (3 mm×8 mm) that was electroplated at 10 mA/cm² with copper (12 μm thick) from a standard copper pyrophosphate bath at room temperature. With a thick benzimidazole coating (4000 Angstroms) obtained by immersion in the Enteck 106A solution at 45° C. for 60 seconds, a good quality copper toil deposited from the copper pyrophosphate bath peeled easily from the copper underlayer, demonstrating the concept of facilitating transfer by chemically reducing the adhesion of copper plated on copper. Other chemical treatments can be used, but the Enteck 106A solution, which is commercially available as an organic solderability preservative (OSP), has the advantages of permitting the copper overlayer adhesion to be adjusted by varying the coating thickness (via the solution immersion time) and having relatively good electrical conductivity (from copper included in the coating), which is beneficial for plating good quality copper overlayers at relatively fast rates.

An alternative method of reducing adhesion of a copper overlayer (on copper) is the use of an anodic electrochemical current or voltage pulse to form an oxide film on the substrate surface. Also, a very thin insoluble organic film might be used as a mechanical barrier for adhesion reduction of a copper overlayer.

If sufficient residual copper is retained on NiO surface 16 after circuit transfer, or an adhesion reducing treatment 28 has been used to ensure transfer of only the top layer of circuit metal, the residual copper can be rethickened in plating bath 24 so that it is not necessary to re-image NiO coating 16 to transfer multiple circuits of the same pattern to polymer sheets 26. To produce a different circuit pattern, the old copper image can be electro-dissolved in plating bath 24 by applying a forward electrical bias (V+) to p-NiO surface 16 relative to plating bath 24 with electrode 25 biased as a cathode (V−). This change in electrical bias erases the old image (residual copper circuitry) so that a new circuit pattern can be formed by the reverse bias photoelectrochemical deposition process described above. As illustrated in FIG. 1, the entire process can be performed by imaging on rotating cylinder 18 so that printed circuits can be produced in a continuous process of applying plating solution 12 as a film 14 on the p-NiO surface 16 of cylinder 18; electrically biasing plating film 14 (V+) with respect to surface 16 (V−); photoelectrochemically depositing seed metal traces by interaction of scanning light beam 20 with surface 16 and plating film 14; thickening the seed metal traces as necessary in plating bath 24; rinsing with water 30 to remove the plating solution; optionally treating the partially thickened circuit electrochemically, chemically, or mechanically to reduce adhesion of subsequently deposited copper (typically deposited during a second pass through bath 24 before contact with polymer material 26); drying with heated gas 32 to prepare for circuit transfer; transferring the metal circuit from surface 16 to polymer laminate material 26; and erasing the circuit image (if required) by changing the electrical bias of surface 16 with respect to plating bath electrode 25. Plating bath 24 may include a purification system (not shown), such as circulation through activated carbon, for example, to remove contaminants such as adhesion reduction treatment chemicals, for example.

The photoelectrochemical circuit fabrication method described above provides significant environmental, cost, and resolution advantages. All of the labor and chemicals expended in conventional photoresist imaging are eliminated and no spent copper etchant solutions are generated. Even allowing for some mushrooming of thicker circuits, one mil lines and spacings, which are beyond the resolution of conventional circuit board processes, are believed to be readily attainable with a focused light beam. For an optimized coating resistance (thickness and resistivity), the copper electrodeposition process should also be fast. Furthermore, circuits generated digitally by means of computer aided design (CAD) software can be made directly into circuits (using a light beam scanning system) without the necessity of generating conventional photoresist masking artwork.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

We claim:

1. A method of fabricating an electronic circuit, comprising the steps of:

providing a surface of semiconductor material;

applying a metal plating solution to cover at least a portion of said semiconductor surface;

illuminating selected areas of said solution-covered semiconductor surface corresponding to a pattern of the electronic circuit;

photoelectrochemically depositing a seed layer of metal on said illuminated areas of said solution-covered semiconductor surface;

treating said deposited seed layer of metal to reduce adhesion of subsequently deposited metal;

subsequently depositing metal on said treated seed layer without further illumination; and transferring said subsequently deposited metal to an alternate substrate to form the electronic circuit.

2. The method of claim 1, wherein said surface providing step further comprises forming a surface of p-type NiO semiconductor material on a nickel substrate.

3. The method of claim 1, wherein said illuminating step comprises scanning said selected areas with a light beam.

4. The method of claim 1, wherein said treating step comprises chemically treating said seed layer with an adhesion reduction coating.

5. The method of claim 4, wherein said treating step comprises chemically treating said seed layer by applying a coating of an alkyl-substituted benzimidazole.

6. The method of claim 1, wherein said step of subsequently depositing metal comprises depositing metal on said treated seed layer from said plating solution.

7. The method of claim 1, further comprising the step of thickening said seed layer before said treating step by further deposition of metal without illumination.

8. The method of claim 1, further comprising the step of redepositing metal on said treated seed layer after said transferring step.

9. The method of claim 1, further comprising the step of dissolving said layer of seed metal deposited on said semiconductor surface after said transferring step.

10. A method of fabricating an electronic circuit, comprising the steps of:

providing a surface of p-type semiconductor material;

applying a metal plating solution to cover at least a portion of said semiconductor surface;

providing said semiconductor surface with a negative electrical bias with respect to said plating solution;

illuminating selected areas of said solution-covered semiconductor surface corresponding to a pattern of the electronic circuit;

photoelectrochemically depositing a seed layer of metal on said illuminated areas of said semiconductor surface to form the electronic circuit;

thickening said seed layer of photoelectrochemically deposited metal in said plating solution;

treating said thickened layer of metal to reduce adhesion of subsequently deposited metal;

subsequently depositing metal on said treated layer without further illumination; and transferring said subsequently deposited metal to an alternate substrate to form the electronic circuit.

11. The method of claim 10, wherein said surface providing step further comprises forming a surface of p-type NiO semiconductor material on a nickel substrate.

12. The method of claim 10, wherein said illuminating step comprises scanning said selected areas with a light beam.

13. The method of claim 10, wherein said treating step comprises chemically treating said seed layer with an adhesion reduction coating.

14. The method of claim 13, wherein said step of chemically treating said seed layer comprises applying a coating of an alkyl-substituted benzimidazole.

15. The method of claim 14, further comprising the step of redepositing metal on said treated layer of metal after said step of transferring said subsequently deposited metal to said alternate substrate.

16. A method of fabricating an electronic circuit, comprising the steps of:

providing a nickel substrate;

forming a surface of p-type NiO on said nickel substrate;

applying a copper plating solution to cover at least a portion of said NiO surface;

providing said NiO surface with a negative electrical bias with respect to said plating solution;

illuminating said solution-covered NiO surface with a light beam in a pattern corresponding to the electronic circuit;

photoelectrochemically depositing a seed layer of copper metal on said illuminated areas of said NiO surface;

thickening said seed layer of photoelectrochemically deposited copper metal in said plating solution without further illumination;

treating said thickened layer of copper metal to reduce adhesion of subsequently deposited copper metal;

subsequently depositing copper metal on said treated layer without further illumination; and transferring said subsequently deposited copper metal to an alternate substrate to form the electronic circuit.

17. The method of claim 16, wherein said treating step comprises applying a coating of alkyl-substituted benzimidazole to said thickened layer of copper metal.

18. The method of claim 16, further comprising the step of redepositing copper metal from said plating solution onto said treated layer after said step of transferring said subsequently deposited copper metal to said alternate substrate.

19. The method of claim 16, further comprising the step of changing said electrical bias of said NiO surface with respect to said plating solution to dissolve said layer of copper metal deposited on said NiO surface after said transferring step.

* * * * *